US009851078B2

(12) United States Patent
Valerio et al.

(10) Patent No.: US 9,851,078 B2
(45) Date of Patent: Dec. 26, 2017

(54) HEAT SINK

(71) Applicants: Theodore Valerio, Carine (AU); Bruno Zulberti, Mariginiup (AU)

(72) Inventors: Theodore Valerio, Carine (AU); Bruno Zulberti, Mariginiup (AU)

(*) Notice: Subject to any disclaimer, the term of this patent is extended or adjusted under 35 U.S.C. 154(b) by 274 days.

(21) Appl. No.: 14/391,962

(22) PCT Filed: Apr. 9, 2013

(86) PCT No.: PCT/AU2013/000362
§ 371 (c)(1),
(2) Date: Oct. 10, 2014

(87) PCT Pub. No.: WO2013/152387
PCT Pub. Date: Oct. 17, 2013

(65) Prior Publication Data
US 2015/0062931 A1 Mar. 5, 2015

(30) Foreign Application Priority Data
Apr. 11, 2012 (AU) .................................. 2012901409

(51) Int. Cl.
*F21V 21/00* (2006.01)
*F21V 29/00* (2015.01)
*B23P 15/26* (2006.01)
*H05K 7/20* (2006.01)
*F21V 29/77* (2015.01)
*H01L 23/367* (2006.01)
*F21Y 115/10* (2016.01)

(52) U.S. Cl.
CPC .............. *F21V 21/00* (2013.01); *B23P 15/26* (2013.01); *F21V 29/2212* (2013.01); *F21V 29/77* (2015.01); *H05K 7/2039* (2013.01); *F21Y 2115/10* (2016.08); *H01L 23/3672* (2013.01); *H01L 2924/0002* (2013.01); *Y10T 29/49826* (2015.01)

(58) Field of Classification Search
None
See application file for complete search history.

(56) References Cited

U.S. PATENT DOCUMENTS

| | | | | | |
|---|---|---|---|---|---|
| 3,438,302 A | * | 4/1969 | Sandor | ................ | F16B 19/1081 411/80.2 |
| 3,819,497 A | * | 6/1974 | Grunwald | .............. | H05K 3/108 205/126 |
| 4,082,578 A | * | 4/1978 | Evancho | ................... | C22F 1/05 148/535 |

(Continued)

FOREIGN PATENT DOCUMENTS

DE 19834734 A1 * 2/2000 ............. B32B 15/08

*Primary Examiner* — Sharon Payne
(74) *Attorney, Agent, or Firm* — Tope-McKay & Associates

(57) ABSTRACT

A heat sink (10) comprising a plurality of parallel fins (12) and a plurality of plates (14). Each plate (14) is located between an adjacent pair of fins (12) and one or more securing members is provided to secure the fins (12) and plates (14) in contact. Each of the plates (14) is formed of a material being softer than the material of the fins (12) such that compression of the fins (12) and plates (14) deforms the surface of the plates (14) to improve thermal conductivity between adjacent fins (12).

28 Claims, 10 Drawing Sheets

(56) References Cited

U.S. PATENT DOCUMENTS

| | | | | |
|---|---|---|---|---|
| 4,583,365 A | * | 4/1986 | John | F28F 13/003 337/119 |
| 6,461,682 B1 | * | 10/2002 | Crotty | C09D 4/00 427/387 |
| 6,722,419 B1 | * | 4/2004 | Lee | G06F 1/20 165/185 |
| 2006/0042727 A1 | * | 3/2006 | Li | B22D 11/003 148/551 |

\* cited by examiner

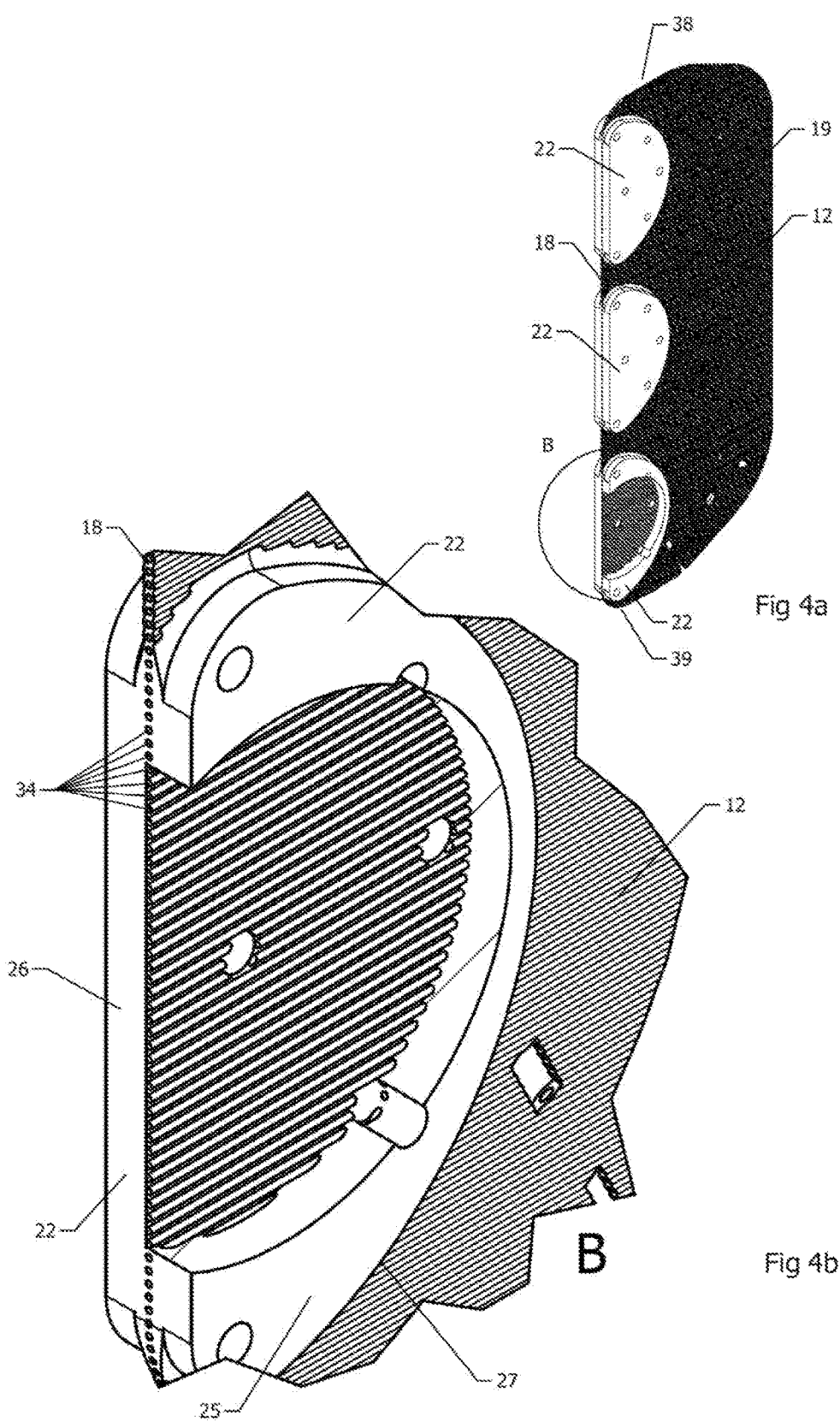

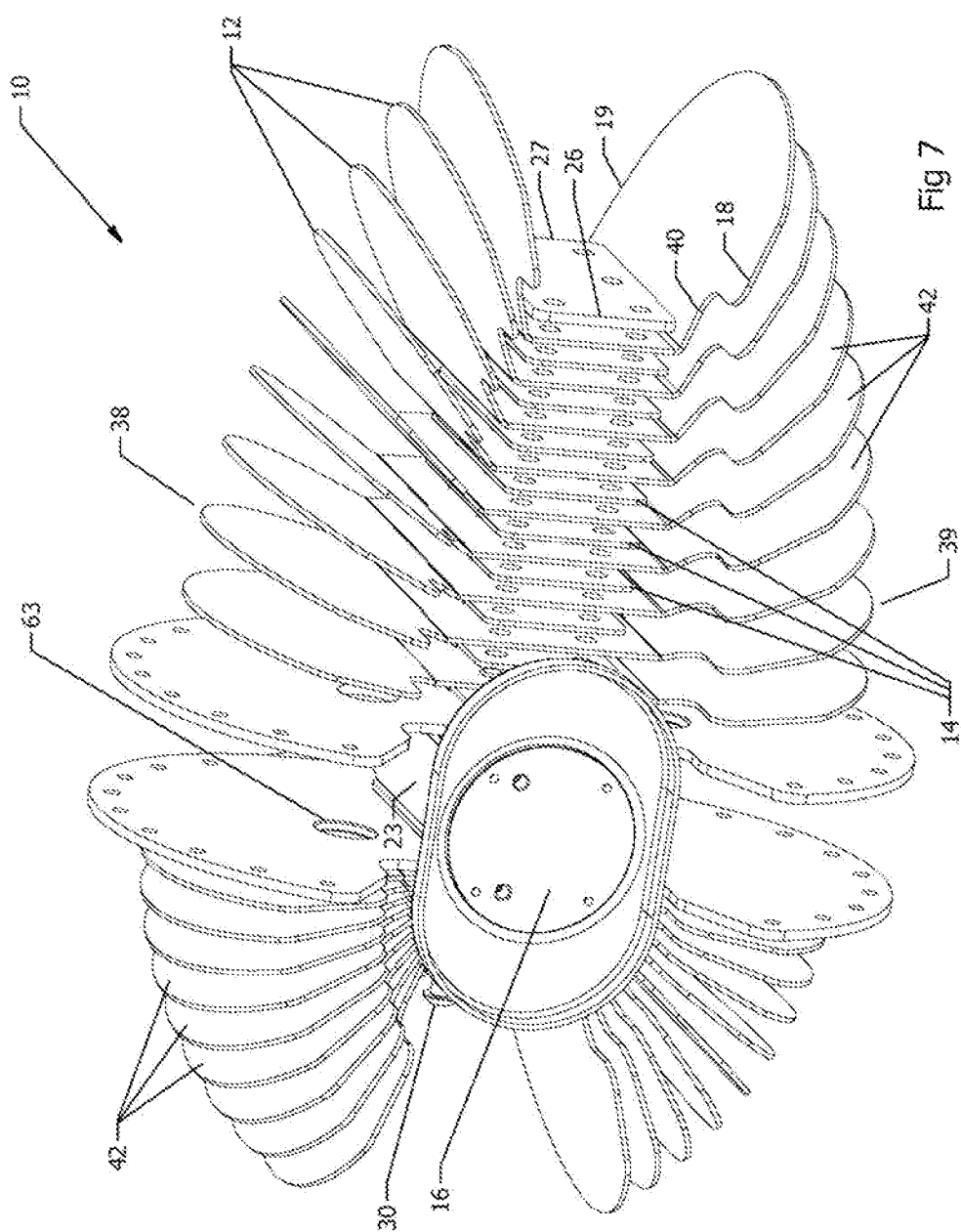

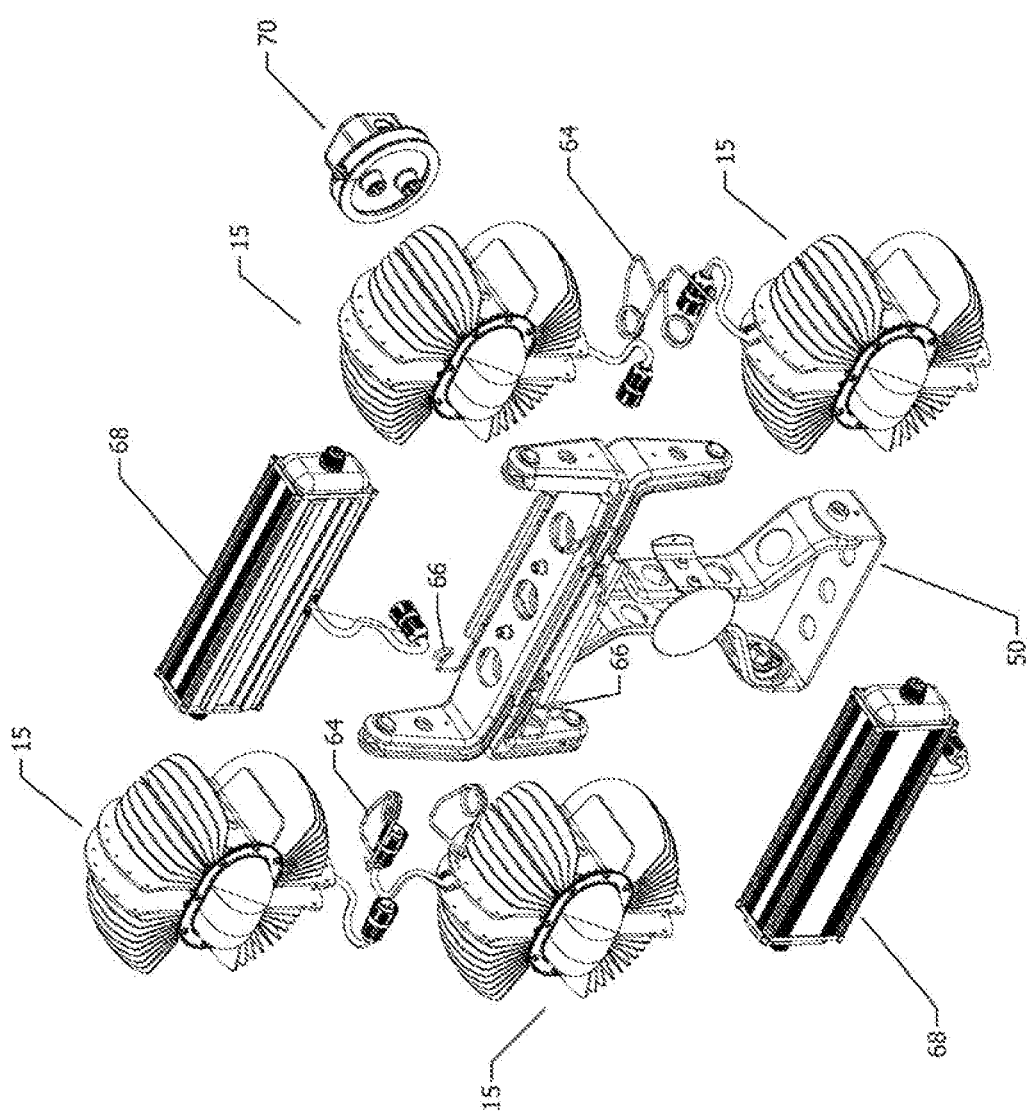

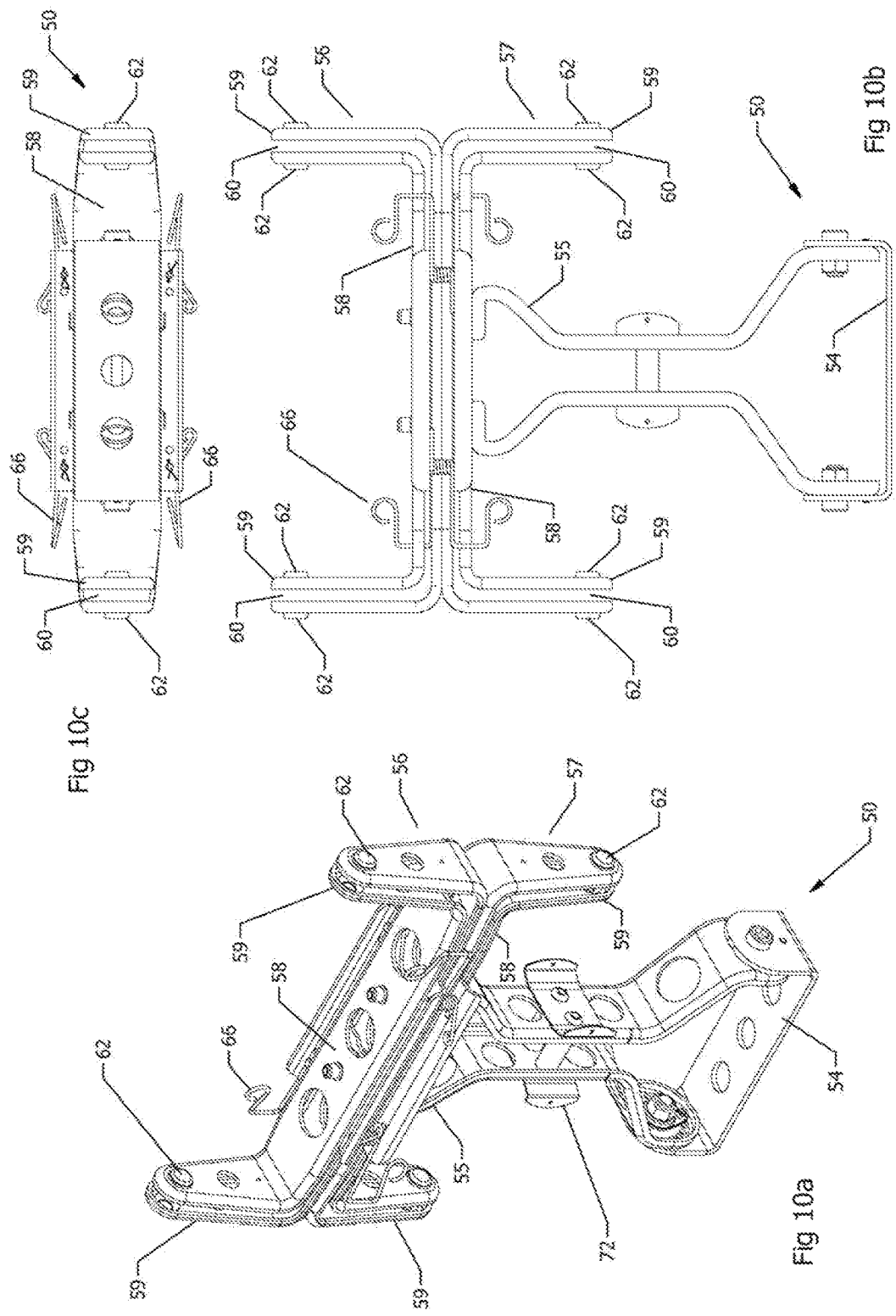

HEAT SINK

FIELD OF THE INVENTION

The present invention relates to a heat sink.

BACKGROUND TO THE INVENTION

Many electronic components require the use of devices to disperse heat. LED lighting is one such example. LED lighting is being used increasingly as a replacement to incandescent or fluorescent lights. While these lights have an improved efficiency, they still emit significant amounts of heat during operation. If this heat is not effectively moved away from the device, the efficiency and the lifespan of the LED lighting units are adversely affected.

While LEDs have in the past more commonly been used in small scale applications, advances have meant they are now finding application in larger scale lighting devices such as outdoor lighting, street lighting and flood lights. In such applications, management of the produced heat is particularly important.

Traditionally, heat sinks have been produced by a material such as aluminium cast or cut to form a body in contact with the lighting and a large number of fins. Heat is transferred to the body by physical contact with the device and the fins provide a large surface area to dissipate the heat transferred to the heat sink.

Current heat sinks are generally produced through either an extrusion or casting. In the case of extrusions, as the required size of the heat sink increases, a larger length section of extrusion may be employed, with limitations. With cast heat sinks, a new design and mould would generally be required.

As a further issue, when the heat transfer requirements go beyond a certain point, the size and weight of this type of aluminium cast or extruded heat sink design becomes an issue. In these circumstances, it is necessary to consider using materials with higher coefficients of thermal conductivity, such as copper, silver and gold. Use of such materials within the heat sink can produce increased efficiency but also results in difficulties in manufacture, particular as the required size of the heat sink increases.

The present invention relates to a construction of a heat sink aimed at providing both efficiency in heat transfer and scalability.

SUMMARY OF THE INVENTION

According to one aspect of the present invention there is provided a heat sink comprising:
a plurality of parallel fins;
a plurality of plates, each plate being located between an adjacent pair of fins; and
one more securing members provided to secure the fins and plates in contact;
wherein each of the plates is formed of a material being softer than the material of the fins such that compression of the fins and plates deforms the surface of the plates to improve thermal conductivity between adjacent fins.

Preferably each of the fins includes first and second opposed side edges and first and second opposed ends and the plates are located between the fins adjacent the first side edges thereof.

In one embodiment, the plates include first side edges located adjacent the first side edges of the fins such that the first side edges of the fins and plates define a mounting surface to which an electrical component may be secured.

Preferably the fins and plates are provided with alignable apertures to receive securing members after compression.

In one embodiment, the securing members comprise damping rivets received through the apertures including collars on ends thereof to secure the fins and plates together.

In a preferred embodiment, the fins include arcuate first and second ends. Preferably the first side edges of the fins include a recessed portion provided generally centrally between the first and second ends to which an electrical component can be secured.

Preferably the plates are rectangular in shape and extend across the width of the fins from the first side edges to the second side edges.

In a preferred embodiment, the fins include angled end portions at the first and second ends thereof. Preferably the angled end portions of each fin angle away from a central planar portion of the fin in the same direction and wherein there is provided a first set of fins in which the angled end portions angle in a first direction and a second set of fins in which the angled end portions angle in a second opposite direction.

In a preferred embodiment, the first set of fins are those located on a first side of a central plane, the central plane being located parallel to and between a central pair of the fins, and the second set of fins are those located on a second opposite side of the central plane. Preferably the angle of the angled end portions relative to the central plane increases progressively for each fin moving away from the central plane.

In a further embodiment, each fin includes one or more engaging portions, each engaging portion comprising a portion of the fin having an increased thickness relative to the main body such that the plates are secured between adjacent side surfaces of the engaging portions.

Preferably each engaging portion includes a planar first side surface extending outwardly from a first side of the fin and a planar second side surface extending outwardly from a second opposite side of the fin such that each plate is secured between the first planar side surface of the engaging portion and the second planar side surface of an engaging portion on the adjacent fin.

Preferably each fin includes opposed first and second side edges and each of the engaging portions includes a first side edge located adjacent the first side edge of the fin such that when a plurality of the fins are secured together, the first side edges of the engaging portions form a mounting surface onto which an electrical component may be secured to draw heat from the electrical component. Preferably the plates are the same shape as the first and second side surfaces of the engaging portions.

In one embodiment, the first side edge of engaging portion is parallel to and coincident with the first side edge of the fin and the engaging portion includes an arcuate second side edge extending from a first end of the first side edge to a second end of the first side edge.

In one embodiment, the fins are formed of an aluminium alloy and the plates are formed of the same alloy that has not been tempered or tempered to a lesser degree. The fins may be formed of 6061-T6 aluminium and the plates formed of the same alloy in the "O" condition.

In one embodiment, the fins comprise aluminium having copper filaments extending across from the first side edge to the second side edge.

In one embodiment, the plates are formed as one or more layers on a first side surface of the fins.

According to a second aspect of the present invention, there is provided a method of constructing a heat sink comprising the steps of:
interleaving a plurality of plates between a plurality of fins, the plates being formed of a material that is softer than the material of the fins;
compressing the fins and plates with a pressure greater than the plastic deformation limit of the plates; and
securing the plates and fins together under high pressure with one or more securing members.

Preferably the method includes the step of locating the fins such that first side edges are adjacent each other to form a mounting surface onto which an electrical component may be secured to draw heat from the electrical component.

In one embodiment, the method includes the step of securing the fins together with clamping rivets and collars.

In one embodiment, the plates are located between adjacent side surfaces of engaging portions on the fins, each engaging portion comprising a portion of the fin having an increased thickness relative to the main body.

The method preferably includes the step of machining the first side edges of the connected fins and plates at a location between the first and second ends thereof.

In one embodiment, the plates are formed as one or more layers on a first side surface of the fins. The plates may be formed on the fins by electroplating.

According to a further aspect of the present invention, there is provided a mounting bracket comprising:
a base having a first end securable to a mounting surface; and
one or more supports secured to a second end of the base, each support comprising includes a central portion and opposed end portions extending generally transversely to the central portion;
wherein each of the end portions comprises a pair of resilient planar members located parallel and adjacent each other to define a gap, each planar member having a lug thereon such that the lugs are receivable in holes provided in a central pair of fins of a light module by flexing of the planar members towards each other.

Preferably there is provided an upper support and a lower support secured to the base adjacent the central portions thereof such that the end portions of the upper support extend away from the base and the end portions of the lower support extending back towards the base.

Preferably the end portions of the upper support are located adjacent the respective end portions of the lower support but extend in opposite directions thereto.

BRIEF DESCRIPTION OF THE DRAWINGS

The invention will now be described, by way of example, with reference to the following drawings, in which:

FIG. 4*a* is an upper perspective view of a fin of the heat sink of FIG. 1 showing a cut away segment of an engaging portion;

FIG. 4*b* is a dose up view of Detail B of FIG. 4*a*;

FIG. 7 is an exploded view of the light module of FIG. 6;

FIG. 9 is an exploded view of the mounting bracket and light modules of FIG. 8;

FIG. 10*a* is an upper perspective view of the mounting bracket of FIG. 8;

FIG. 10*b* is a front view of the mounting bracket of FIG. 8; and

FIG. 10*c* is a top view of the mounting bracket of FIG. 8.

DETAILED DESCRIPTION OF PREFERRED EMBODIMENTS

Figure 1:
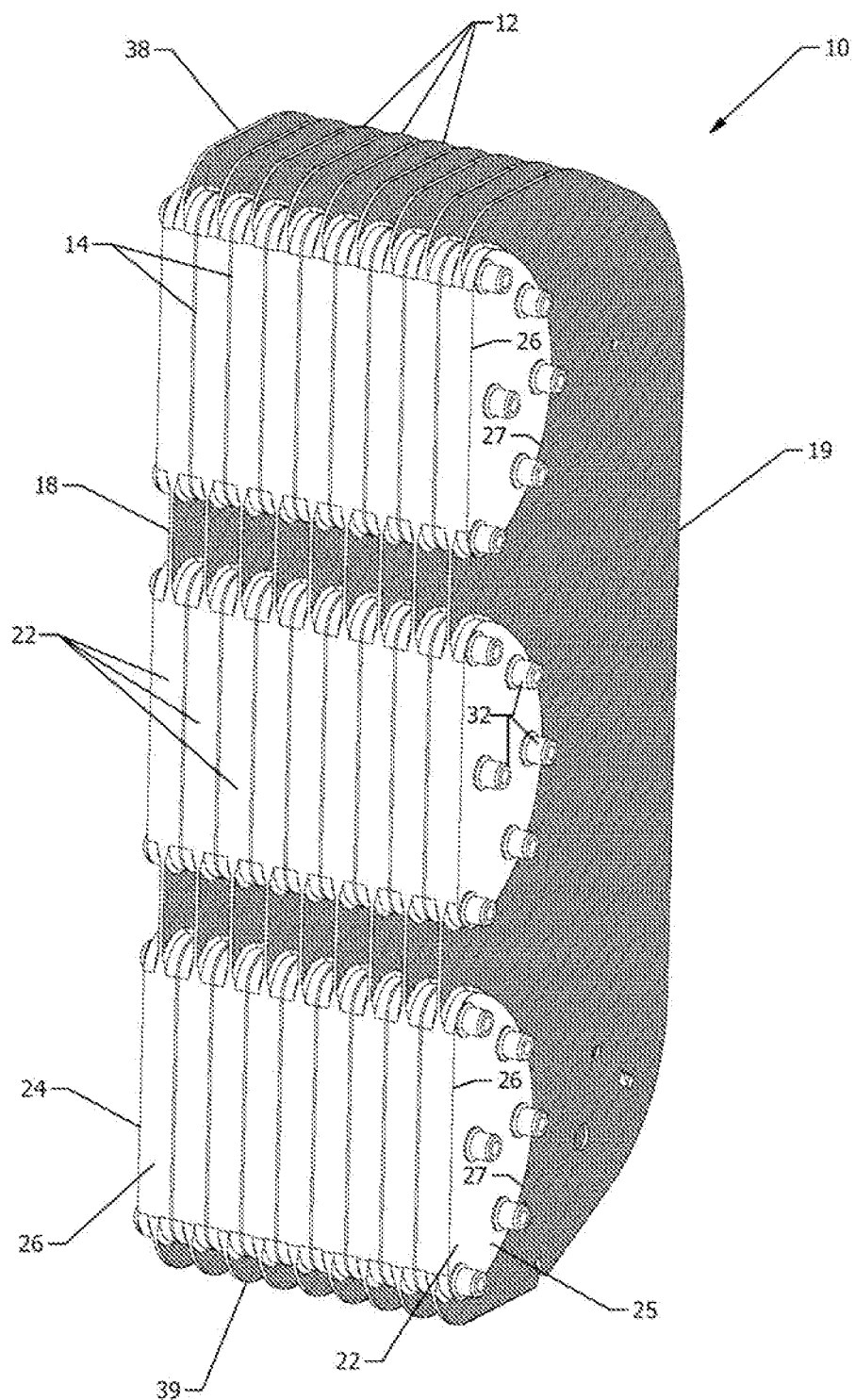
FIG. 1 is an upper perspective view of a first embodiment of a heat sink in accordance with the present invention.

Referring to FIGS. 1 to 5, there is shown a first embodiment of a heat sink in accordance with the invention. The heat sink 10 is formed from a plurality of fins 12 and plates 14. Each of the fins 12 comprises a planar member having at least a portion thereof oriented adjacent and parallel to the other fins 12. At least one plate 14 is located between each adjacent pair of fins 12.

In the embodiment shown, each of the fins 12 comprises a generally rectangular sheet of a material having a suitable thermal conductivity to dissipate heat absorbed by the fin 12 out through its surface area. Each fin 12 includes a first side edge 18 and a second side edge 19. The first side edge 18 is to be located in use adjacent a component from which heat is to be absorbed and dispersed, such as an lighting unit 16. The fins 12 are to be connected together adjacent the first side edges 18 in order to allow heat to transfer between the fins 12. The fins 12 are separated adjacent first and second ends 38 and 39 and also adjacent the second side edges 19 to allow air flow between the fins 12 for heat dissipation.

The fins 12 are each provided with a plurality of engaging portions 22 along the first side edge 18 thereof. In the embodiment shown, there are provided three engaging portions 22 along each fin 12. A first engaging portion 22 is provided adjacent the first end 38 of the fin 12, a second engaging portion 22 is provided adjacent the second opposite end 39 of the fin 12 and a third engaging portion 22 is provided generally centrally on the first side edge 18 of the fin 12.

Each engaging portion 22 comprises a portion of the fin 12 having an increased thickness relative to the main body of the fin 12. Each engaging portion 22 includes a planar first side surface 24 extending outwardly from a first side of the fin 12 and a planar second side surface 25 extending outwardly from a second opposite side of the fin 12. The first side surface 24 of each engaging portion 22 is to be located in use adjacent the second side surface 25 of an adjacent fin 12.

Each engaging portion 22 comprises a linear first side edge 26 located adjacent and parallel to the first side edge 18 of the fin 12. Each engaging portion 22 in the embodiment shown also includes a second arcuate edge 27. The second arcuate edge 27 extends from a first end of the first side edge 26 to a second end of the first side edge 26.

Each fin 12 also includes a plurality of apertures through the engaging portion 22 from the first side surface 24 to the second side surface 25. The apertures on each engaging portion 22 are in the same location such that when the fins 12 are located parallel and adjacent each other with the engaging portions 22 in alignment, the apertures line up in order to receive securing members, in the form of clamping rivets 30. The rivets 30 are received through all of the fins 12 and include collars 32 on ends thereof to secure the fins 12 together.

A plate 14 is provided to be received between each adjacent pair of fins 12. The plates 14 are the same shape as the engaging portions 22 and are located in use between the engaging portions 22. That is, each plate 14 includes a linear first side edge 26 and an arcuate second side edge 27. Each plate 14 therefore engages generally across the first and second side surfaces 24 and 25 of the adjacent engaging portions 22.

Each plate 14 comprises a relatively thin sheet of material being softer than the material forming the engaging portions 22 of the fins 12. The engaging portions 22 may, for example, be formed of an aluminium alloy and the plates 14 formed of the same or similar alloy that has not been tempered, or tempered to a lesser degree. In one embodiment for example, the engaging portions 22 of the fins 12 may be formed of 6061-T6 aluminium with the plates 14 formed of the same alloy in the "O" condition (no temper).

Figure 2:
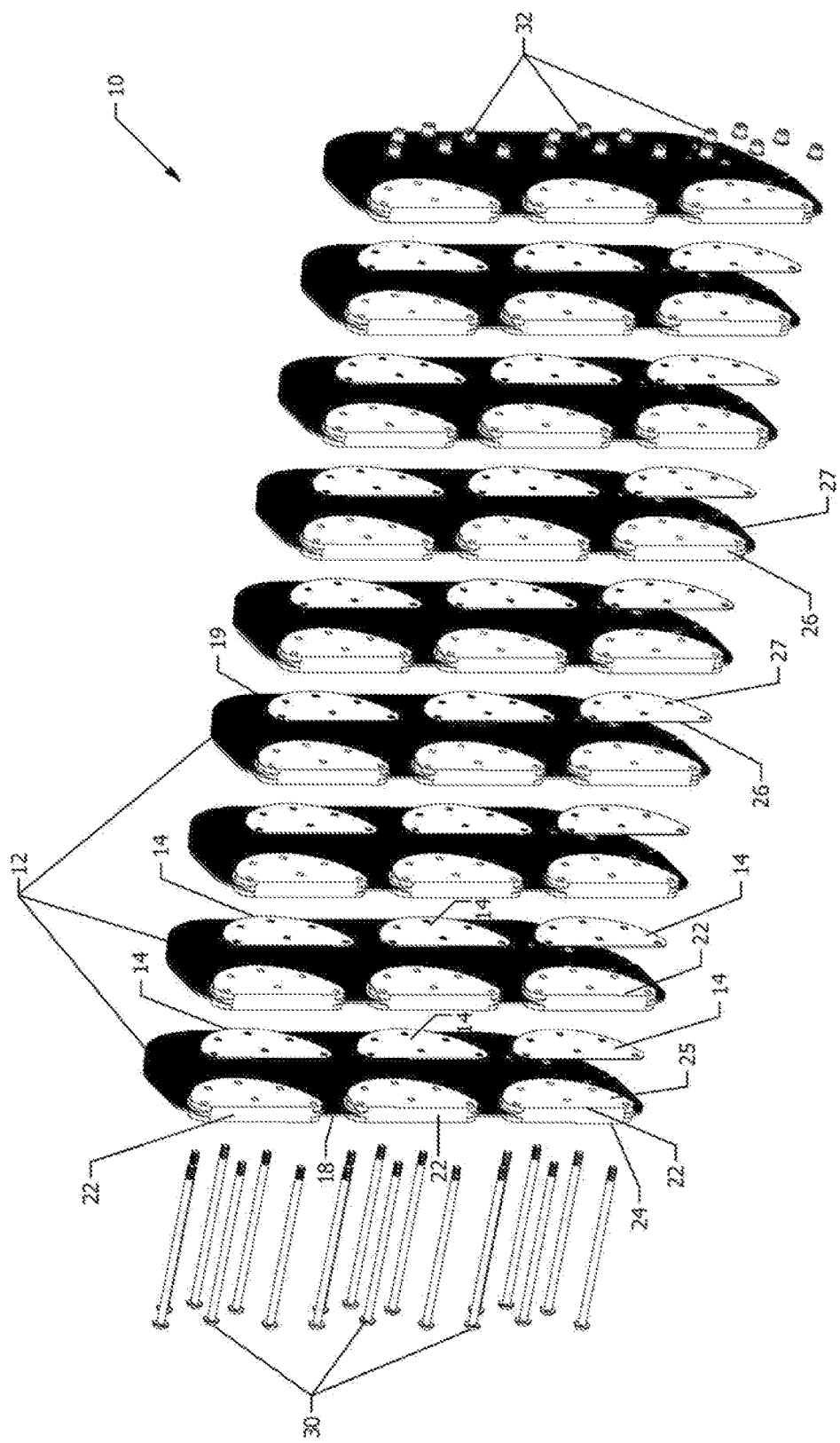
FIG. 2 is an exploded view of the heat sink of FIG. 1.
Figures 3A, 3B:
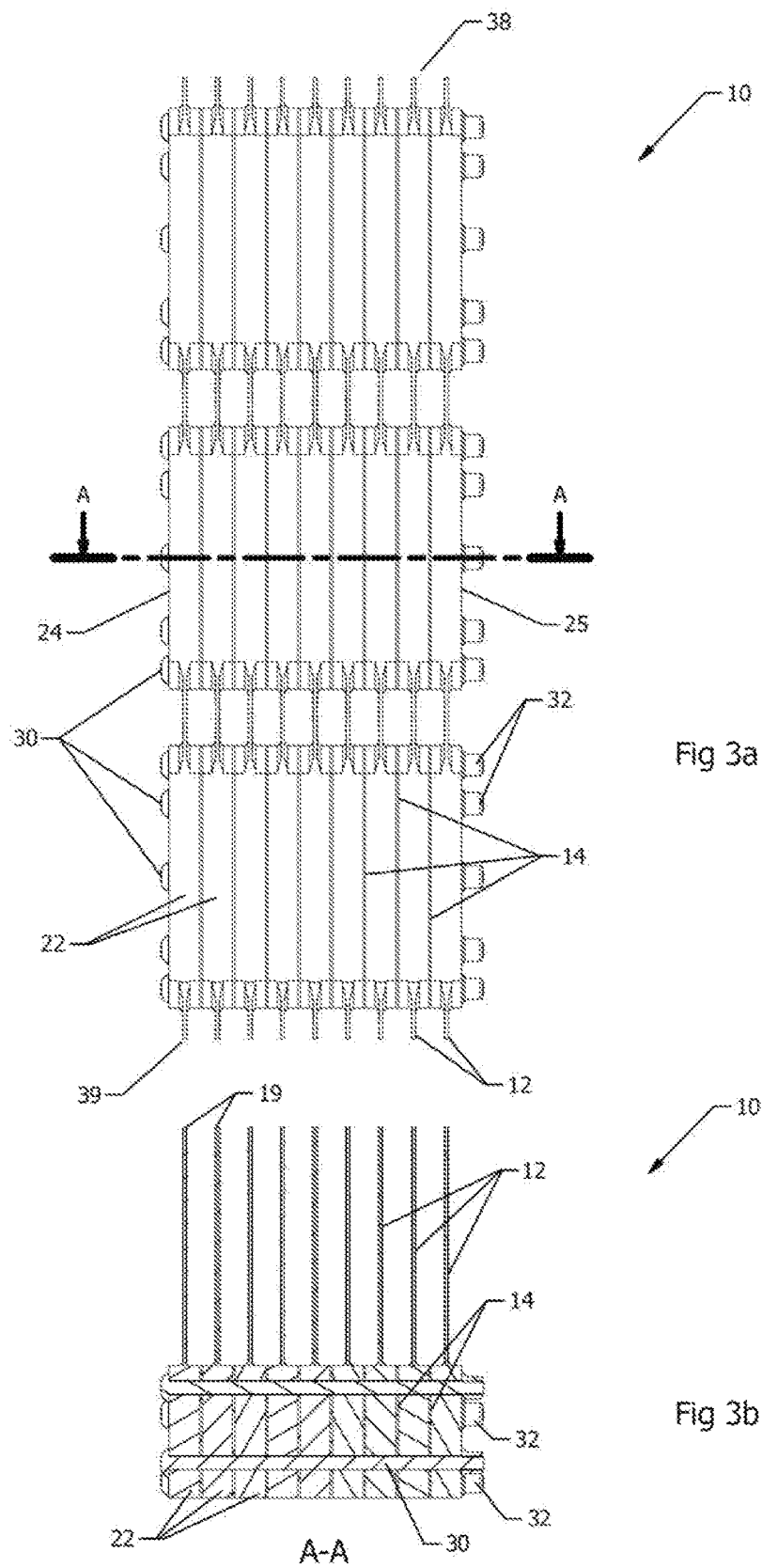
FIG. 3*a* is a front view of the heat sink of FIG. 1.
FIG. 3*b* is a top cross sectional view of the heat sink of FIG. 3*a* through the line A-A.

During assembly, the fins 12 and plates 14 are arranged as shown in FIG. 2, with the plates 14 interleaved between each adjacent pair of engaging portions 22. The assembled heat sink 10 is then hydraulically pressed at a value exceeding the plastic deformation limit of the plates 14. This compression causes deformation of surface imperfections of the plate 14, thereby increasing the thermal contact between the fins 12. It has been found that this process greatly reduces the thermal resistance allowing the thermal contact conductance of the assembled heat sink 10 to approach that of a homogeneous material.

Once the compression process has been completed, the assembled fins 12 are then secured together by damping rivets 30 and collars 32.

The arrangement shown allows a heat sink 10 to be formed of a range of sizes simply by increasing the number of fins 12. A light module 15 is formed by securing one or more light units 16 to the first side edges 18 of the fins 12.

Figure 5:
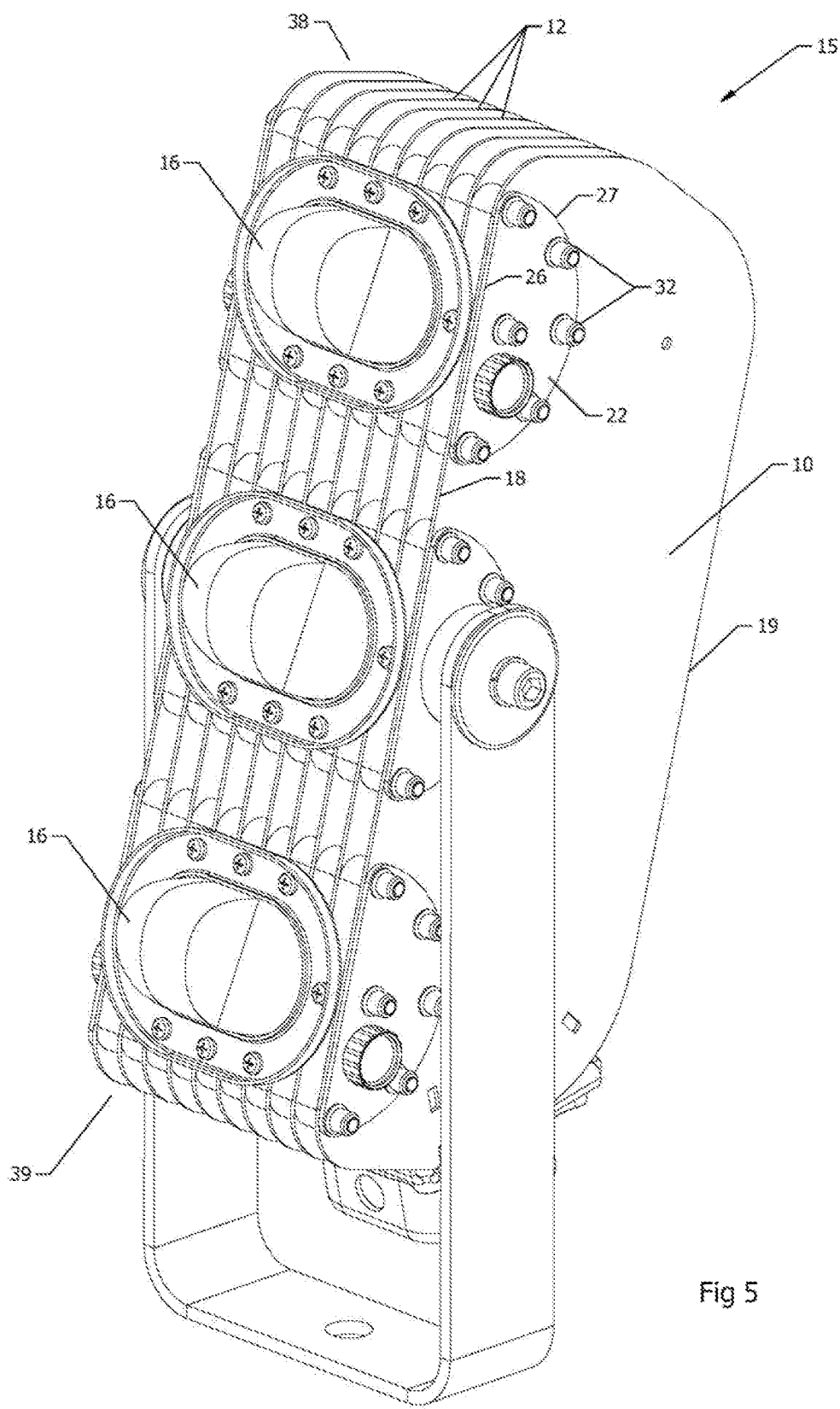
FIG. 5 is an upper perspective view of a light module formed using the heat sink of FIG. 1.

The size of the heat sink 10 may therefore be easily varied to suit the size and configuration of light units 16. The light units 16 are secured to the heat sink 10 across the first side edges 26 of the engaging portions 22, as can be seen in FIG. 5. The first side edges 26 of adjacent engaging portions 22 form a mounting surface onto which the light unit 16 is secured. The number of engaging portions 22 may also be varied to suit the number of light units 16 required. In the embodiment of FIG. 5, three engaging portions 22 are provided for each fin 12 in order to allow mounting of three light units 16.

The arrangement also improves the ability to use specialised fins 12 and other heat spreading technologies to increase the overall efficiency of the heat sink 10. FIG. 4 shows a configuration in which the fins 12 comprise a cast aluminium body having copper filaments 34 incorporated therein. The copper filaments 34 extend across the fins 12 from the first side edges 18 to the second side edges 19 to draw heat across the body of the fins 12 due to the increased thermal conductance. The modular nature of the heat sink arrangement allows easier incorporation of such heat spreading techniques into the fins 12.

Figure 6A:
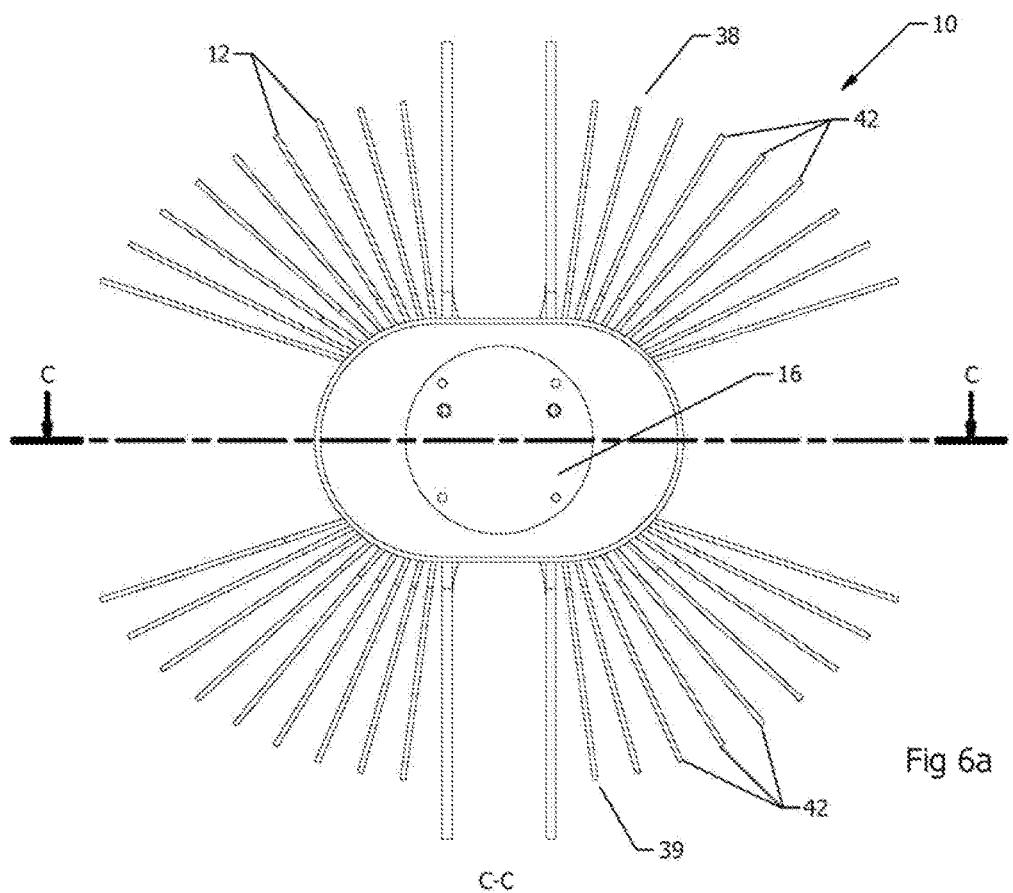
FIG. 6*a* is a front view of a light module using a second embodiment of a heat sink in accordance with the present invention.
Figure 6B:
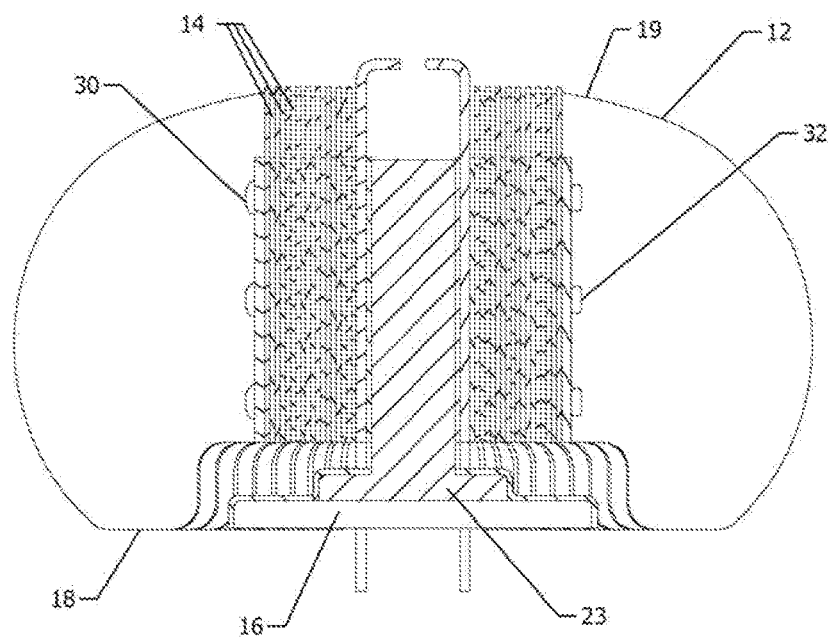
FIG. 6*b* is a cross sectional view of the light module of FIG. 6*a* through the line C-C.
Figure 8C:
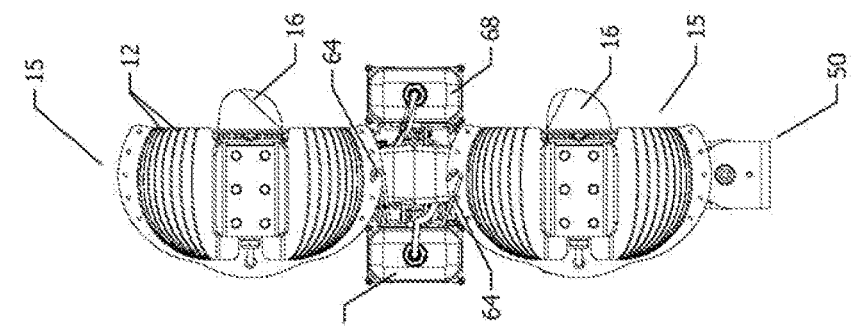
FIG. 8*c* is a side view of the mounting bracket and light modules of FIG. 8*a*.
Figure 8B:
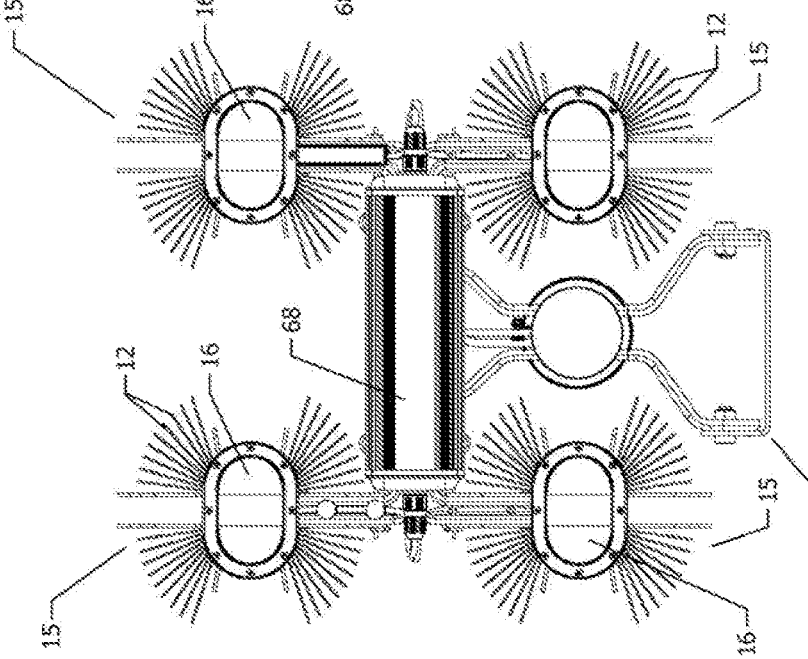
FIG. 8*b* is a front view of the mounting bracket and light modules of FIG. 8*a*.
Figure 8A:
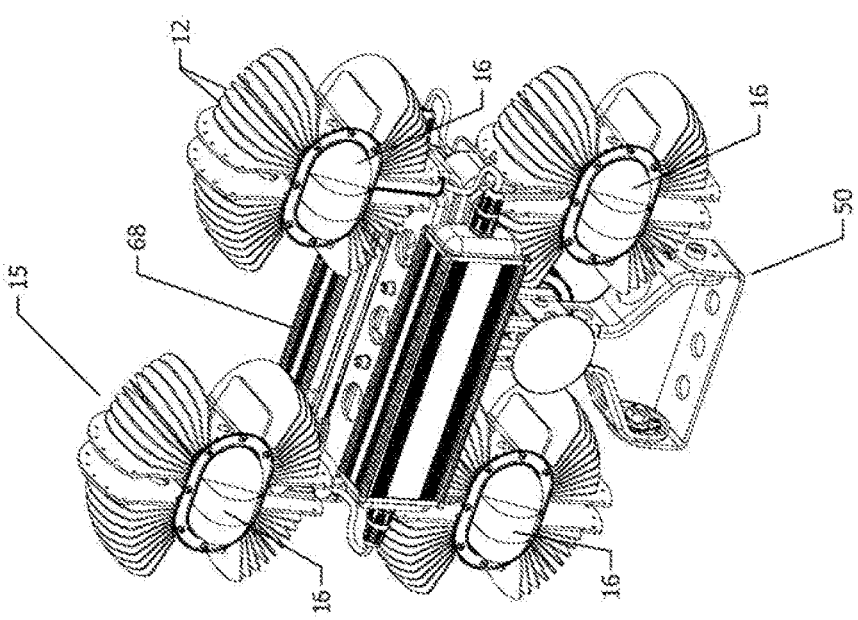
FIG. 8*a* is an upper perspective view of four of the light modules of FIG. 6 secured to a mounting bracket.

FIGS. 6 and 7 show a second embodiment of a heat sink 10 in accordance with the invention. The heat sink 10 of FIGS. 7 and 8 is similar to that of FIGS. 1 to 5 and like reference numerals are used to denote like parts.

In the embodiment of FIGS. 6 and 7, the fins 12 do not include the engaging portions 22 of the first embodiment, The plates 14 are simply inserted between the fins 12 and the resulting heat sink 10 compressed as described previously. The first embodiment utilised the engaging portions 22 to create a homogenous base (formed by the adjacent first side edges 26 of the engaging portions) on which the light unit 16 could be mounted. In the second embodiment, the mounting surface for connection of the light units 16 would be formed by machining the first side edges 18 of the connected fins 12 and plates 14 in the desired location.

The fins 12 of the second embodiment include arcuate first and second ends 38 and 39 as can be seen in the Figures. Also, the first side edges 18 of the fins 12 include a recessed portion 40. In the embodiment shown, the recessed portions 40 are provided generally centrally between the first and second ends 38 and 39 of the fins 12. The light units 16 are to be secured to the connected fins 12 in the recessed portions 40 as can be seen.

The plates 14 of the second embodiment are rectangular in shape. The plates 14 include first side edges 26 which are located in use adjacent the first side edges 18 of the fins 12 and second side edges 27 which are located in use adjacent second side edges 19 of the fins 12. The plates 14 therefore extend across the width of the fins 12 from the first side edges 18 to the second side edges 19.

The fins 12 also include angled end portions 42 at the first and second ends 38 and 39 thereof. The angled end portions 42 of each fin 12 each angle away from a central portion of the fin 12 in the same direction. The heat sink 10 is provided a first set of fins 12 in which the angled end portions 42 angle in a first direction and a second set of fins 12 in which the angled end portions 42 angle in a second opposition direction.

In particular, the first set of fins 12 are those located on a first side of a central plane and the second set of fins 12 are those located on a second side of the central plane, where the central plane is the plane located parallel to and between a central pair of the fins 12. As can be seen, the angle of the angled end portions 42 relative to the central plane increases progressively for each fin 12 moving away from the central plane.

In the embodiment of FIGS. 6 and 7, there is also shown a central member 23 located between the central pair of fins 12. The central member 23 is located between a pair of plates 14 provided between the central member 23 and the adjacent fins 12 and is connected directly through to the light unit 16. This central member 23 may be provided to increase heat flow into the heat sink 10.

While the plates 14 of the two embodiments of FIGS. 1 to 7 have been shown as members, it will be appreciated that they may be formed as separate layers of the fins 12. For example, the plates 14 may be formed by a process such as electroplating, where the material of the plates 14 are deposited onto the fins 12 at the appropriate locations. Each fin 12, for example, may have a layer of the plate 14 material deposited on the first side surface adjacent the first side edge 18. The fins 12 can then be connected and compressed as described previously such that a plate 14 is provided between each adjacent pair of fins 12.

As shown in FIGS. 8 to 10, a mounting bracket 50 may be provided for mounting one or more light modules 15. The mounting bracket 50 comprises a base 52 having a first end 54 securable to a mounting surface and a second end 55 to which is secured one or more supports. In the embodiment shown, there is provided an upper support 56 and a lower support 57.

Each of the supports 56 includes a central portion 58 and opposed end portions 59 extending generally transversely to the central portion 58. The upper support 56 is arranged such that the central portion 58 is secured to the second end 55 of the base 52, with the end portions 59 extending generally away from the base 52. The lower support 57 is also arranged such that the central portion 58 is secured to the second end 55 of the base 22 but with the end portions 59 extending back towards the base 52. The end portions 59 of the upper support 56 are located adjacent the respective end portions 59 of the lower support 57 but extend in opposite directions thereto.

Each of the end portions 59 comprises a pair of planar members located parallel and adjacent each other to define a gap 60. The planar members include lugs 62 on opposed surfaces thereof. The planar members may be flexed toward each other and are resilient such that they will then return to the original parallel position.

Each light module 15 formed by the heat sink 10 may be connected to one of the end portions 59 of the upper or lower supports 56 and 57 as can be seen in FIG. 8. As can be seen in FIG. 7, the central pair of fins 12 each include holes 63. The arrangement is such that the end portions 59 may be pushed between the central pair of fins 12, thereby flexing the planar members inwardly as the lugs 62 engage adjacent surfaces of the fins 12. The lugs 62 are received in the holes 63 and the planar members of the end portions 59 flex back outwardly to engage with the fins 12.

A retaining clip 64 is provided for each end portion 59 to connect between the end portion 59 and the light module 15 to further retain the light module 15.

The mounting bracket 50 is also provided with driver mounting clips 66 to secure driver units 68. Each driver unit 68 is securable by the driver mounting clip 66 adjacent the central portion 58 of the supports 56 and 57 to connect to the light units 15. A junction box module 70 is provided to connect between an end of each driver unit 68 and the adjacent light module 15. The junction boxes 70 are supported on junction box mounting clips 72.

The mounting bracket 50 thereby provides a flexible device for mounting a plurality of light modules 15 for operation in a simple modular fashion.

It will be readily apparent to persons skilled in the relevant arts that various modifications and improvements may be made to the foregoing embodiments, in addition to those already described, without departing from the basic inventive concepts of the present invention.

The invention claimed is:

1. A heat sink comprising:
    a plurality of parallel fins;
    a plurality of plates, each plate being located between an adjacent pair of fins; and
    one or more securing members provided to secure the fins and plates in contact;
    wherein each of the plates is formed of a material being softer than the material of the fins such that compression of the fins and plates deforms the surface of the plates to improve thermal conductivity between adjacent fins.

2. The heat sink in accordance with claim 1, wherein each of the fins comprises first and second opposed side edges and first and second opposed ends, and the plates are located between the fins adjacent the first side edges thereof.

3. The heat sink in accordance with claim 2, wherein the plates comprise first side edges located adjacent the first side edges of the fins such that the first side edges of the fins and plates define a mounting surface to which an electrical component may be secured.

4. The heat sink in accordance with claim 3, wherein the fins and plates are provided with alignable apertures to receive securing members after compression.

5. The heat sink in accordance with claim 4, wherein the securing members comprise clamping rivets received through the apertures comprising collars on ends thereof to secure the fins and plates together.

6. The heat sink in accordance with claim 5, wherein the fins comprise arcuate first and second ends.

7. The heat sink in accordance with claim 6, wherein the first side edges of the fins comprise a recessed portion provided generally centrally between the first and second ends to which an electrical component can be secured.

8. The heat sink in accordance with claim 7, wherein the plates are rectangular in shape and extend across the width of the fins from the first side edges to the second side edges.

9. The heat sink in accordance with claim 8, wherein the fins comprise angled end portions at the first and second ends thereof.

10. The beat sink in accordance with claim 9, wherein the angled end portions of each fin angle away from a central planar portion of the fin in the same direction, and wherein there is provided a first set of fins in which the angled end portions angle in a first direction, and a second set of fins in which the angled end portions angle in a second opposite direction.

11. The heat sink in accordance with claim 10, wherein the first set of fins are those located on a first side of a central plane, the central plane being located parallel to and between a central pair of the fins, and the second set of fins are those located on a second opposite side of the central plane.

12. The heat sink in accordance with claim 11, wherein the angle of the angled end portions relative to the central plane increases progressively for each fin moving away from the central plane.

13. The heat sink in accordance with claim 1, wherein each fin comprises one or more engaging portions, each engaging portion comprising a portion of the fin having an increased thickness relative to the main body such that the plates are secured between adjacent side surfaces of the engaging portions.

14. The heat sink in accordance with claim 13, wherein each engaging portion comprises a planar first side surface extending outwardly from a first side of the fin and a planar second side surface extending outwardly from a second opposite side of the fin, such that each plate is secured between the first planar side surface of the engaging portion and the second planar side surface of an engaging portion on the adjacent fin.

15. The heat sink in accordance with claim 14, wherein each fin comprises opposed first and second side edges and each of the engaging portions comprises a first side edge located adjacent the first side edge of the fin such that when a plurality of the fins are secured together, the first side edges of die engaging portions form a mounting surface onto which an electrical component may be secured to draw heat from the electrical component.

16. The heat sink in accordance with claim 15, wherein the plates are the same shape as the first and second side surfaces of the engaging portions.

17. The heat sink in accordance with claim 16, wherein the first side edge of engaging portion is parallel to and coincident with the first side edge of the fin, and the engaging portion comprises an arcuate second side edge extending from a first end of the first side edge to a second end of the first side edge.

18. The heat sink in accordance with claim 17, wherein the fins are formed of an aluminum alloy and the plates are formed of the same alloy that has not been tempered or tempered to a lesser degree.

19. The heat sink in accordance with claim 18, wherein the fins are formed of 6061-T6 aluminum and the plates formed of the same alloy in the "O" condition.

20. The heat sink in accordance with claim 19, wherein the fins comprise aluminum having copper filaments extending across from the first side edge to the second side edge.

21. The heat sink in accordance with claim 20, wherein the plates are formed as one or more layers on a first side surface of the fins.

22. A method of constructing a heat sink comprising the steps of:
   interleaving a plurality of plates between a plurality of parallel fins, each plate being positioned between an adjacent pair of fins, wherein each of the plates is formed of a material that is softer than the material of the fins;
   securing the fins and plates in contact with one or more securing members; and
   compressing the fins and plates with a pressure greater than the plastic deformation limit of the plates such that compression of the fins and plates deforms the surface of the plates to improve thermal conductivity between adjacent fins.

23. The method in accordance with claim 22, comprising the step of locating the fins such that first side edges are adjacent each other to form a mounting surface onto which an electrical component may be secured to draw heat from the electrical component.

24. The method in accordance with claim 22, comprising the step of securing the fins together with clamping rivets and collars.

25. The method in accordance with claim 22, wherein the plates are located between adjacent side surfaces of engaging portions on the fins, each engaging portion comprising a portion of the fin having an increased thick less relative to the main body.

26. The method in accordance with claim 22, comprising the step of machining the first side edges of the connected fins and plates at a location between the first and second ends thereof.

27. The method in accordance with claim 22, comprising the step of forming the plates as one or more layers on a first side surface of the fins.

28. The method in accordance with claim 27, wherein the plates are formed on the tins by electroplating.

* * * * *